(12) United States Patent
Sasaki et al.

(10) Patent No.: US 9,687,868 B2
(45) Date of Patent: Jun. 27, 2017

(54) ROLLED FILM FORMATION APPARATUS

(71) Applicant: TOPPAN PRINTING CO., LTD., Taito-ku (JP)

(72) Inventors: Yasuhiro Sasaki, Taito-ku (JP); Mitsuru Kano, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 14/556,608

(22) Filed: Dec. 1, 2014

(65) Prior Publication Data
US 2015/0083043 A1    Mar. 26, 2015

Related U.S. Application Data

(63) Continuation of application No. PCT/JP2013/064351, filed on May 23, 2013.

(30) Foreign Application Priority Data

May 31, 2012    (JP) .................. 2012-123969

(51) Int. Cl.
*C23C 16/00*    (2006.01)
*B05B 13/02*    (2006.01)
(Continued)

(52) U.S. Cl.
CPC ........ B05B 13/0221 (2013.01); C23C 14/562 (2013.01); C23C 16/45551 (2013.01);
(Continued)

(58) Field of Classification Search
USPC ........ 118/719, 249, 500; 427/255, 395, 576, 427/209, 535
See application file for complete search history.

(56) References Cited

U.S. PATENT DOCUMENTS 3,586,229 A    6/1971  Kamada et al.
4,029,249 A *  6/1977  Nagel ............... B65H 20/12
                                           226/193
(Continued)

FOREIGN PATENT DOCUMENTS

CN    1070141 A      3/1993
CN    101406108 A    4/2009
(Continued)

OTHER PUBLICATIONS

International Search Report issued Aug. 20, 2013 in PCT/JP2013/064351 (with English translation).
(Continued)

*Primary Examiner* — Yewebdar Tadesse
(74) *Attorney, Agent, or Firm* — Oblon, McClelland, Maier & Neustadt, L.L.P.

(57) ABSTRACT

A rolled film formation apparatus including a first chamber in which a first precursor is applied to a substrate, a second chamber in which a second precursor is applied to the substrate such that the first and second precursors react with each other and that an atomic layer is deposited on the substrate, a third chamber in which a purge gas is applied to the substrate, and conveyance roller pairs which are positioned in the first, second and third chambers, and convey the substrate. Each conveyance roller pair includes a first roller and a second roller which sandwich the substrate in a thickness direction of the substrate. At least one of the first and second rollers has an outer peripheral surface having a surface unevenness. The substrate is moved back and forth among the first, second and third chambers. The atomic layer is deposited more than once on the substrate.

18 Claims, 3 Drawing Sheets

(51) Int. Cl.
*C23C 14/56* (2006.01)
*C23C 16/455* (2006.01)
*C23C 16/54* (2006.01)
*B65H 20/02* (2006.01)

(52) U.S. Cl.
CPC ............ *C23C 16/545* (2013.01); *B65H 20/02* (2013.01); *B65H 2301/51145* (2013.01)

(56) References Cited

U.S. PATENT DOCUMENTS

| | | | | |
|---|---|---|---|---|
| 5,357,178 | A * | 10/1994 | Kapitan | D06B 3/345 318/6 |
| 5,945,195 | A * | 8/1999 | McDonald | B43M 5/04 283/106 |
| 6,007,895 | A * | 12/1999 | McDonald | B43M 5/04 281/2 |
| 6,056,323 | A * | 5/2000 | McDonald | B43M 5/04 281/2 |
| 2002/0174782 | A1 * | 11/2002 | Klug | B44B 5/0047 101/3.1 |
| 2005/0172897 | A1 | 8/2005 | Jansen | |
| 2007/0228470 | A1 | 10/2007 | Levy | |
| 2007/0281089 | A1 | 12/2007 | Heller et al. | |
| 2010/0054826 | A1 | 3/2010 | Hieda | |
| 2010/0143710 | A1 | 6/2010 | Dickey et al. | |
| 2011/0039671 | A1 * | 2/2011 | Chou | B65H 27/00 492/28 |
| 2014/0020627 | A1 * | 1/2014 | Kano | C23C 16/45551 118/719 |

FOREIGN PATENT DOCUMENTS

| | | |
|---|---|---|
| JP | 2007-522344 | 8/2007 |
| JP | 2009-149963 | 7/2009 |
| JP | 2009-531548 | 9/2009 |
| JP | 2009-540122 | 11/2009 |
| JP | 2010-052872 | 3/2010 |
| JP | 2011-178490 | 9/2011 |
| WO | 2007/112370 | 10/2007 |
| WO | 2010/065966 | 6/2010 |
| WO | 2012/133541 | 10/2012 |

OTHER PUBLICATIONS

Mikko Ritala, et al., "Atomic Layer Deposition", Deposition and Processing of Thin Films, vol. 1, 2002, 57 pages.
Extended European Search Report issued Feb. 24, 2016 in Patent Application No. 13796425.0.
Combined Chinese Office Action and Search Report issued Feb. 26, 2016 in Patent Application No. 201380027869.9.
Office Action issued Oct. 25, 2016, in Chinese Patent Application No. 201380027869.9 (with English-language translation).

* cited by examiner

ROLLED FILM FORMATION APPARATUS

CROSS-REFERENCE TO RELATED APPLICATIONS

The present application is a continuation of International Application No. PCT/JP2013/064351, filed May 23, 2013, which is based upon and claims the benefits of priority to Japanese Application No. 2012-123969, filed May 31, 2012. The entire contents of these applications are incorporated herein by reference.

TECHNICAL FIELD

The present invention relates to a rolled film formation apparatus.

BACKGROUND ART

There has been a technique where a substrate to be rolled such as paper or a plastic film which is formed in an elongated shape and can be wound is unwound in a vacuum, and a metal film or a metal oxide film is continuously formed on the substrate to be rolled by a film forming method such as vapor deposition or sputtering. Such a technique has been used in a method of manufacturing a metal luster film used in forming gold and silver threads, a gas barrier film for food packaging, an electrode of a film capacitor or an optical film having a reflection prevention function or the like.

SUMMARY OF INVENTION

According to one aspect of the present invention, a rolled film formation apparatus includes a first chamber in which a first precursor is applied to a substrate, a second chamber in which a second precursor is applied to the substrate such that the first and second precursors react with each other and that an atomic layer is deposited on the substrate, a third chamber in which a purge gas for purging the first or second precursor is applied to the substrate, and conveyance roller pairs which are positioned in the first chamber, the second chamber and the third chamber, and convey the substrate. Each of the conveyance roller pairs includes a first roller and a second roller which sandwich the substrate in a thickness direction of the substrate, at least one of the first and second rollers has an outer peripheral surface having a surface unevenness, and the conveyance roller pairs are structured such that the substrate is moved back and forth among the first chamber, the second chamber and the third chamber, and that the atomic layer is deposited more than once on the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
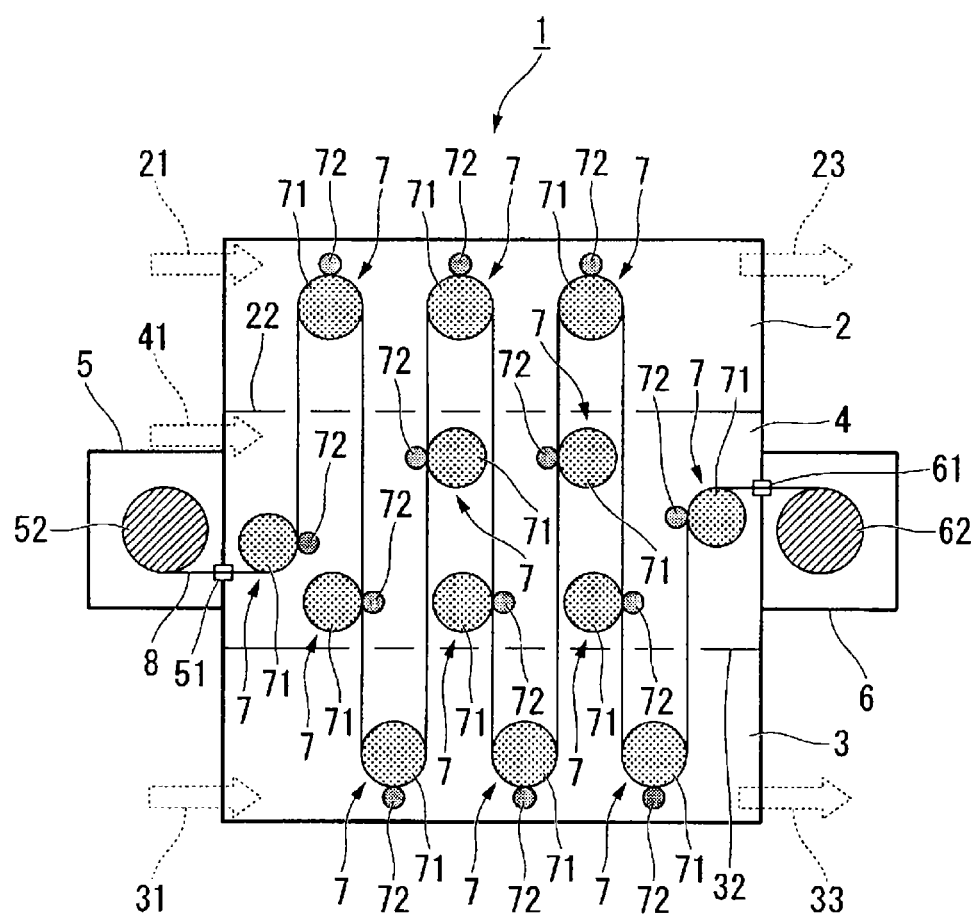
FIG. 1 is a schematic view of a rolled film formation apparatus provided with substrate conveyance roller parts according to one embodiment of the present invention.

The embodiments will now be described with reference to the accompanying drawings, wherein like reference numerals designate corresponding or identical elements throughout the various drawings.

Hereinafter, one embodiment of the present invention is explained by reference to FIG. 1 to FIG. 3B.

As shown in FIG. 1, a rolled film formation apparatus 1 according to one embodiment of the present invention includes: a first zone 2 which constitutes a first vacuum chamber into which a first precursor gas 21 (hereinafter simply described as a first precursor 21) is introduced; a second zone 3 which constitutes a second vacuum chamber into which a second precursor gas 31 (hereinafter simply described as a second precursor 31) is introduced; and a third zone 4 which constitutes a third vacuum chamber into which a purge gas 41 is introduced.

The rolled film formation apparatus 1 includes: an unwinding roll 52 which is arranged in an unwinding chamber 5; a winding roll 62 which is arranged in a winding chamber 6; and conveyance roller parts 7 which convey a rollable substrate 8 (hereinafter simply referred to as a substrate 8) between the unwinding roll 52 and the winding roll 62.

In the above-mentioned embodiment, the conveyance roller part 7 includes roller pairs 70 each including two different rollers, that is, a guide roller 71 (second roller) and a nip roller 72 (first roller) on both edge portions of the conveyance roller part 7 in the width direction of the substrate 8 (that is, the roller pairs 70 are arranged in a spaced-apart manner from each other in the width direction of the substrate 8). The guide rollers 71 are connected to a drive mechanism 10 such as a motor, for example, and the substrate 8 is held and conveyed by controlling a rotational speed of the guide rollers 71 using the drive mechanism 10.

To continuously deposit an atomic layer on a surface of the substrate 8, one atomic layer can be deposited on the surface of the substrate 8 by allowing the substrate 8 to pass through the third zone 4, the first zone 2, the third zone 4, the second zone 3, and the third zone 4 in this order using the conveyance roller parts 7.

The rolled film formation apparatus 1 according to one embodiment of the present invention is designed such that the substrate 8 is made to pass through the above-mentioned zones by the conveyance roller parts 7 the number of times necessary for depositing anatomic layer having a desired film thickness on the surface of the substrate 8. That is, the rolled film formation apparatus 1 according to one embodiment of the present invention is designed such that a cycle of an atomic layer deposition is repeated the number of times necessary for depositing an atomic layer having a desired film thickness on the surface of the substrate 8.

It is preferable that the substrate 8 to be used is one selected from flexible materials such as a plastic film, a plastic sheet, a metal foil, a metal sheet, a paper, and an unwoven fabric. Although a thickness of the substrate 8 is not particularly limited, the thickness of the substrate 8 is preferably set to a value which falls within a range from 10 μm to 1000 μm.

The substrate 8 is unwound from the unwinding roll 52 and is conveyed to the third zone 4.

A partition plate is arranged between the unwinding chamber 5 in which the unwinding roll 52 is arranged and the third zone 4. An unwinding chamber opening portion 51 which is necessary for allowing the substrate 8 to pass through the partition plate is formed in the partition plate. The substrate 8 is conveyed to the third zone 4 from the unwinding chamber 5 through the unwinding chamber opening portion 51.

An inert gas is introduced into the third zone 4 as a purge gas 41. As such an inert gas, a gas is suitably selected from a nitrogen gas, a helium gas, an argon gas and the like.

Figure 2A:
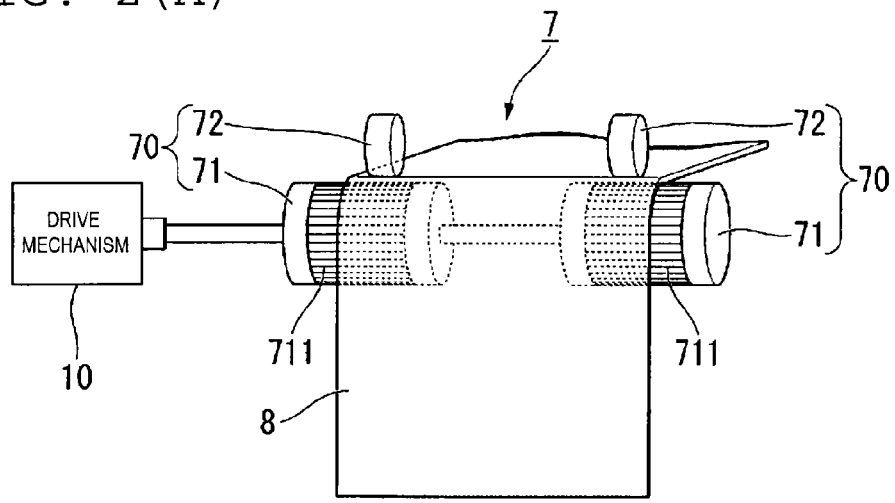
FIG. 2A is a schematic view for explaining the constitution of nip rollers and guide rollers in the substrate conveyance roller part provided to the rolled film formation apparatus according to one embodiment of the present invention.
Figure 2B:
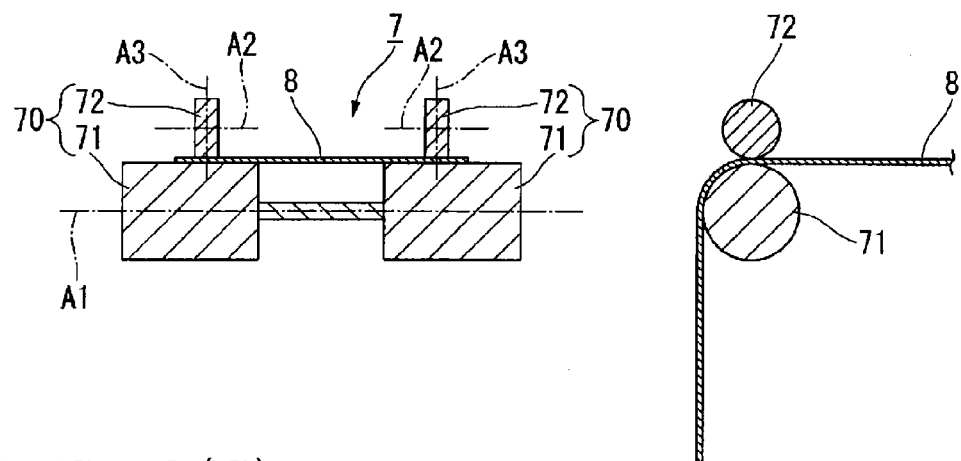
FIG. 2B is a cross-sectional view for explaining the constitution of the nip rollers and the guide rollers in the substrate conveyance roller part provided to the rolled film formation apparatus according to one embodiment of the present invention.
Figure 2C:
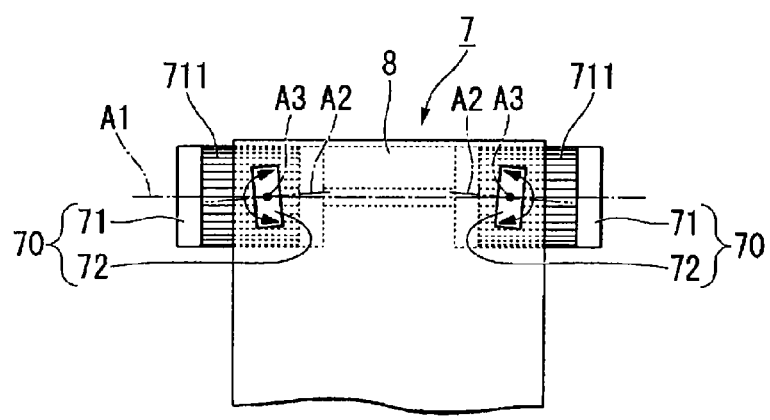
FIG. 2C is a plan view for explaining the constitution of the nip rollers and the guide rollers in the substrate conveyance roller part provided to the rolled film formation apparatus according to one embodiment of the present invention.

A conceptual view showing the structure of the conveyance roller part 7 of the above-mentioned embodiment is shown in FIG. 2A to FIG. 2C.

The conveyance roller part 7 sandwiches a front surface and a back surface of both edge portions of the substrate 8 in the width direction using the roller pairs 70 each having the guide roller 71 and the nip roller 72, and transfers power to the substrate 8 simultaneously. A pressure at the time of sandwiching the substrate 8 (nip pressure) is preferably set to a value which falls within a range from 0.0001 MPa or more to 0.1 MPa or less.

Further, the roller pairs 70 are arranged on both edge portions of the substrate 8 in the width direction (in the direction of the axis of rotation of the roller pairs) in such a manner that one roller pair 70 is arranged for each edge portion. A material for forming the guide roller 71 and a material for forming the nip roller 72 may be respectively suitably selected corresponding to the substrate 8, and is not limited to specific materials. For example, as a material for forming the guide roller 71, stainless steel (SUS), aluminum or the like can be named. On the other hand, as a material for forming the nip roller 72, urethane rubber or silicon rubber can be named.

The front surface of the guide roller 71 has a surface unevenness 711. Here, the surface unevenness 711 is not limited to a particular shape provided that a proper frictional force can be imparted to the substrate 8 by the surface unevenness 711. For example, the surface unevenness 711 may be lines formed on the surface of the guide roller 71 parallel to the axis of rotation of the guide roller 71 at intervals in the circumferential direction of the guide roller 71 (for example, see FIG. 2A).

The surface unevenness 711 of the guide roller 71 is not limited to such a line shape. The guide roller 71 may produce an anti-slip effect by generating a frictional force on the surface of the guide roller 71 by a simple concavo-convex shape formed on the surface of the guide roller 71, a roughness formed by applying a chemical on the surface of the guide roller 71, or the like.

With respect to the guide rollers 71 and the nip rollers 72 which sandwich the front surface and the back surface of both edge portions of the substrate 8 in the width direction, the nip roller 72 is provided such that an axis of rotation A2 of the nip roller 72 is rotatable about an axis A3 which is orthogonal to the substrate 8.

The axes of rotation of the nip rollers 72 are rotated so as to adjust slackening or the like of the substrate 8 which is brought into contact with the nip rollers 72. To be more specific, by pulling the substrate 8 along the conveyance direction, it is possible to adjust the movement of the substrate 8 at the time of conveying the substrate 8 such as the correction of slackening of the substrate 8 or the correction of the trajectory of the meandering substrate 8. It is preferable to set an angle of the axis of rotation A2 of the nip roller 72 with respect to the axis of rotation A1 of the guide roller 71 to 5 degrees or less, and it is more preferable to set the angle of the axis of rotation A2 of the nip roller 72 with respect to the axis of rotation A1 of the guide roller 71 to a value which falls within a range from 0.5 degrees to 2 degrees inclusive.

In mounting the rollers having such a rotatable axis of rotation in the conveyance roller part 7, it is preferable that a diameter of the nip roller 72 having the rotatable axis of rotation be set smaller than a diameter of the guide roller 71 not having a rotatable axis of rotation and constituting the other roller as shown in FIG. 2C. Further, the guide roller 71 which constitutes the other roller may also have a rotatable axis of rotation in the same manner as the nip roller 72.

It is sufficient that at least either one of the nip roller 72 and the guide roller 71 has the rotatable axis of rotation. That is, both the nip roller 72 and the guide roller 71 may have the rotatable axis of rotation.

The substrate 8 which is sandwiched by the conveyance roller parts 7 is conveyed to the first zone 2 through a plurality of opening portions formed in a first zone partition plate 22 which is arranged between the third zone 4 and the first zone 2.

A first precursor 21 is introduced into the first zone 2. Accordingly, when the substrate 8 passes through the first zone 2, the first precursor 21 is adsorbed to both surfaces of the substrate 8.

During the time that the substrate 8 passes through the first zone 2, only both edge portions of the substrate 8 are sandwiched by the conveyance roller parts 7. Accordingly, there is no possibility that both surfaces of the substrate 8 to which the first precursor 21 is adsorbed are brought into contact with machine parts arranged in the inside of the rolled film formation apparatus 1.

A material for forming the first precursor 21 is suitably selected corresponding to a desired material to be deposited on the surface of the substrate 8. For example, when a material to be deposited on the surface of the substrate 8 is aluminum oxide, trimethylaluminum is used as a material for forming the first precursor 21.

As a material for forming the first precursor 21 which can be used in this embodiment, materials listed in non-patent literature 1 can be used corresponding to a desired deposition film.

A conveyance speed of the substrate 8 in the first zone 2 is calculated based on a saturation adsorption time and an elapsed time such that a necessary time for the substrate 8 to pass through the first zone 2 does not become longer than the saturation adsorption time.

The substrate 8 to which the first precursor 21 is adsorbed in saturation in the first zone 2 is conveyed to the third zone 4 again through the plurality of opening portions formed in the first zone partition plate 22 arranged between the first zone 2 and the third zone 4.

A gas in the first zone 2 is discharged by a vacuum pump, and a pressure in the third zone 4 is held at a higher level than a pressure in the first zone 2. Accordingly, the first precursor 21 introduced into the first zone 2 is minimally diffused into the third zone 4. It is preferable that the difference in pressure between the first zone 2 and the third zone 4 when the first precursor 21 is introduced into the first zone 2 be set to a value which falls within a range from 0.01 Pa to 1 Pa inclusive.

Next, the substrate 8 which is sandwiched by the conveyance roller parts 7 is conveyed to the second zone 3 through a plurality of opening portions formed in the second zone partition plate 32 arranged between the third zone 4 and the second zone 3.

During the time that the substrate 8 passes through the third zone 4, a surplus first precursor 21 which is adsorbed to the substrate 8 is vaporized and is purged. A conveyance speed of the substrate 8 in the third zone 4 is calculated based on a passing distance such that a sufficient purging time can be acquired.

A second precursor 31 is introduced into the second zone 3. During the time that the substrate 8 passes through the second zone 3, an adsorbate of the first precursor 21 which is adsorbed to both surfaces of the substrate 8 reacts with the second precursor 31 thus generating a desired material film.

During the time that the substrate 8 passes through the second zone 3, only both edge portions of the substrate 8 are sandwiched by the conveyance roller parts 7. Accordingly, when the adsorbate of the first precursor 21 and the second precursor 31 react with each other, there is no possibility that both surfaces of the substrate 8 are brought into contact with machine parts arranged in the inside of the rolled film formation apparatus 1.

A material for forming the second precursor 31 is suitably selected corresponding to a desired material to be deposited on the surface of the substrate 8. For example, when a material to be deposited on the surface of the substrate 8 is aluminum oxide, water, ozone, or atomic oxygen is used as a material for forming the second precursor 31.

As a material of the second precursor 31 which can be used in this embodiment, a material listed in non-patent literature 1 can be used corresponding to a desired deposition film.

A conveyance speed of the substrate 8 in the second zone 3 is calculated based on a reaction time and a passing distance such that the reaction time is longer than a necessary time for the substrate 8 to pass through the second zone 3.

After the adsorbate of the first precursor 21 and the second precursor 31 react with each other in the second zone 3, the substrate 8 is conveyed to the third zone 4 again through a plurality of opening portions formed in the second zone partition plate 32 arranged between the second zone 3 and the third zone 4.

A gas in the second zone 3 is discharged by a vacuum pump, and a pressure in the third zone 4 is held at a higher level than a pressure in the second zone 3. Accordingly, the second precursor 31 introduced into the second zone 3 is minimally diffused into the third zone 4. It is preferable that the difference in pressure between the second zone 3 and the third zone 4 when the second precursor 31 is introduced into the second zone 3 be approximately set to a value which falls within a range from 0.01 Pa to 1 Pa inclusive.

The above-mentioned steps constitute one cycle of atomic layer deposition. By performing the cycle one time, one atomic layer is deposited on the surface of the substrate 8. By repeating such a cycle plural times, it is possible to form an atomic layer deposition film having a desired film thickness on the surface of the substrate 8.

The rolled film formation apparatus 1 shown in FIG. 1 has three zones including the first zone 2, the second zone 3 and the third zone 4. However, provided that these zones are arranged such that the above-mentioned cycle can be repeated plural times, the number of zones is not particularly limited. In the rolled film formation apparatus 1 shown in FIG. 1, three zones including the first zone 2, the third zone 4 and the second zone 3 are arranged in the order from the above. However, six zones including the first zone 2, the third zone 4, the second zone 3, the first zone 2, the third zone 4 and the second zone 3 may be arranged in the order from the above, for example.

During the time that the above-mentioned cycle is repeated plural times, a conveyance speed of the substrate 8 is set to a lowest speed selected from a plurality of conveyance speeds calculated based on times necessary for exposing the substrate 8 in the above-mentioned first zone 2, second zone 3 and third zone 4 and passing distances that the substrate 8 passes through the respective zones.

After the above-mentioned cycle is repeated plural times so that an atomic layer deposition film having a desired film thickness is formed on the surface of the substrate 8, the substrate 8 is wound up by the winding roll 62.

A partition plate is arranged between the third zone 4 and the winding chamber 6 in which the winding roll 62 is arranged. A winding chamber opening portion 61 which allows the substrate 8 to pass therethrough is formed in the partition plate. After the atomic layer deposition film is formed, the substrate 8 is conveyed to the winding chamber 6 from the third zone 4 through the winding chamber opening portion 61.

It is preferable that the conveyance roller part 7 be arranged in any one of the first zone 2, the second zone 3 and the third zone 4. In other words, it is preferable that the conveyance roller part 7 be arranged so as not to stride over the plural zones out of the first zone 2, the second zone 3 and the third zone 4. By arranging the conveyance roller part 7 in such a manner that the conveyance roller part 7 does not stride over the plural zones, it is possible to favorably suppress the formation of an atomic layer deposition film on the conveyance roller part 7, to be more specific, on the surfaces of the guide roller 71 and the nip roller 72.

Figure 3A:
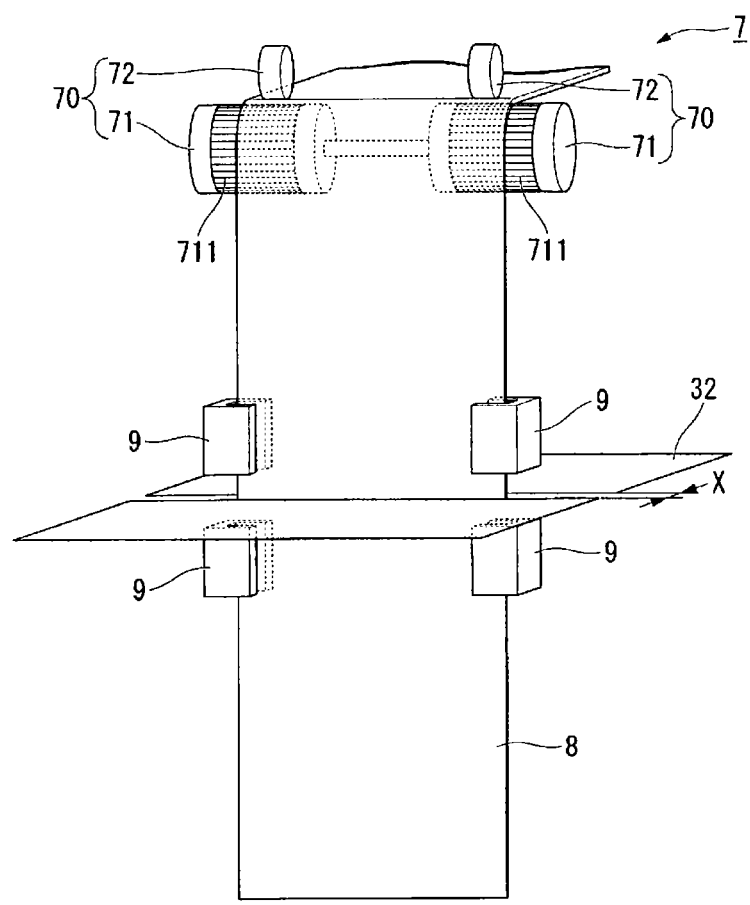
FIG. 3A is a schematic view for explaining the constitution of guide rails provided to the rolled film formation apparatus according to one embodiment of the present invention.
Figure 3B:
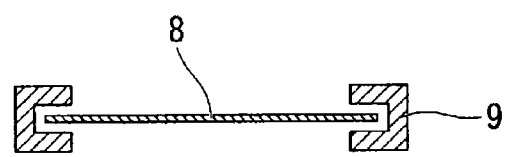
FIG. 3B is a cross-sectional view for explaining the constitution of the guide rails provided to the rolled film formation apparatus according to one embodiment of the present invention.

Further, it is preferable to provide guide rails 9 shown in FIG. 3A and FIG. 3B to the opening portions formed in the above-mentioned respective partition plates. The guide rails 9 are auxiliary parts for making the substrate 8 which passes through the opening portion formed in the partition plate arranged between the zones minimally brought into contact with the partition plate. With the use of the guide rails 9, the substrate 8 is accurately conveyed through the opening portion. Accordingly, a size of the opening portion (opening portion width size X) can be decreased. Due to such a constitution, it is possible to suppress the contamination of precursors introduced into the first zone 2 and the second zone 3 by a purge gas 41 introduced into the third zone 4 to a low level.

For example, to consider the case where the guide rails 9 are not provided to the opening portion, it is necessary to form the opening portion having an opening portion width size X of approximately 5 mm. On the other hand, when the guide rails 9 are provided to the opening portion, it is sufficient to form the opening portion having the opening portion width size X of approximately 1 mm.

It is also preferable that the guide rails 9 be provided so as to sandwich both edge portions of the substrate 8 (see FIG. 3A, for example). By aligning contact portions between the roller pairs 70 and the substrate 8 and contact portions between the guide rails 9 and the substrate 8 with each other, it is possible to suppress a size of region where the substrate 8 is damaged.

A place where the guide rails 9 are provided may be suitably set corresponding to a thickness of the substrate 8 or a conveyance speed of the substrate 8 without any problem. However, when the rigidity of the substrate 8 is low so that the substrate 8 exhibits an extremely unstable movement at the time of conveying the substrate 8, it is preferable to provide the conveyance roller part 7 in the vicinity of the partition plate.

Next, the manner of operation of the rolled film formation apparatus 1 according to the above-mentioned embodiment is explained.

According to the rolled film formation apparatus 1 of the above-mentioned embodiment having the above-mentioned constitution, only both edges of the substrate 8 are held and hence, a contact portion between the conveyance roller part 7 and the substrate 8 is limited to both edge portions of the substrate 8. Accordingly, a contact area between the guide rollers 71 or the nip rollers 72 and the substrate 8 can be suppressed to a required minimum. Further, a region of the substrate 8 where the substrate 8 is damaged by a contact with the conveyance roller part 7 can be made small.

Instead of arranging one roller pair 70 having the guide roller 71 and the nip roller 72 on one edge of the substrate 8 singly, the roller pairs 70 are arranged on both edges of the substrate 8 on one-to-one basis, both edges of the substrate 8 can be held simultaneously and hence, the substrate 8 can be conveyed while preventing slackening of the substrate 8. Accordingly, rubbing or slipping which occurs on a contact portion between the substrate 8 and the roller pairs 70 at the time of conveying the substrate 8 can be reduced.

By sandwiching the substrate 8 using the roller pairs 70, the substrate 8 can be firmly sandwiched and hence, the displacement of the substrate 8 which may occur at the time of conveying the substrate 8 can be reduced. Accordingly, rubbing or slipping which occurs on the contact portion between the substrate 8 and the roller pairs 70 at the time of conveying the substrate 8 can be further reduced.

Further, by forming the groove shape 711 on the outer peripheral surface of the guide roller 71, a frictional force can be generated with respect to the substrate 8. Accordingly, rubbing or slipping which occurs on the contact portion between the substrate 8 and the roller pairs 70 at the time of conveying the substrate 8 can be further reduced.

By providing the nip rollers 72 having the rotatable axis of rotation A2, the direction of the nip rollers 72 can be adjusted and hence, the nip rollers 72 can be moved such that the directions of the nip rollers 72 follow the substrate 8. Further, by conveying the substrate 8 such that the substrate 8 is always stretched, the slackening of the substrate 8 can be corrected or the trajectory of the meandering substrate 8 can be corrected. As a result, the substrate 8 is always inserted into the roller pairs 70 in a planar shape with no slackening. Accordingly, rubbing or slipping which may occur due to a contact between the substrate 8 and the roller pairs 70 can be reduced.

By operating the drive mechanism which is connected to the guide rollers 71, it is possible to convey the substrate 8 while controlling rotational speeds of the guide rollers 71. Further, to compare with the case where the substrate 8 is conveyed at a uniform speed without using the above-mentioned drive mechanism, in this embodiment, the substrate 8 and the roller pairs 70 can be brought into contact with each other in a stable manner and hence, the substrate 8 can be conveyed without causing the deformation of the substrate 8. That is, in this embodiment, it is possible to prevent the deformation of the substrate 8 which may be caused when the substrate 8 and the roller pairs 70 are brought into contact with each other.

Although one embodiment of the present invention has been described in detail by reference to drawings heretofore, the specific constitution of the rolled film formation apparatus according to the present invention is not limited to the above-mentioned embodiment, and various changes in design and the like can be made without departing from the gist of the present invention.

In the above-mentioned embodiment, the drive mechanism which rotates either one of the guide rollers 71 and the nip rollers 72 is not described. However, the guide rollers 71 or the nip rollers 72 may be rotated and controlled by directly connecting the guide rollers 71 or the nip rollers 72 to the various kinds of motors such as a servo motor, or the guide rollers 71 or the nip rollers 72 may be rotated and controlled using other known drive mechanisms. Alternatively, the substrate 8 may be conveyed by operating the winding roll and a drive mechanism interlockingly with each other without directly operating a motor and rollers interlockingly with each other, and the guide rollers 71 or the nip rollers 72 may be rotated depending on the substrate 8 to be transported.

In the above-mentioned embodiment, the roller pairs 70 are formed of two roller pairs arranged in a spaced-apart manner in the width direction of the substrate 8, and each of the roller pair 70 includes two different rollers formed by the guide roller 71 and the nip roller 72. However, the roller pairs 70 may be formed of three ore more roller pairs arranged in a spaced-apart manner in the width direction of the substrate 8 each of which is constituted of two different rollers formed by the guide roller 71 and the nip roller 72. Alternatively, only one roller pair may be used without making the roller pairs spaced apart from each other. From a viewpoint of adjusting the slackening of the substrate 8 or the like, as described in the above-mentioned embodiment, it is preferable to use the roller pairs 70 arranged in a spaced-apart manner in the width direction of the substrate 8 and each having two rollers.

Next, a method of manufacturing a film using the above-mentioned rolled film formation apparatus 1 is explained.

With the use of the above-mentioned rolled film formation apparatus 1, a film having the substrate 8 and an atomic layer deposition film formed on the surface of the substrate 8 can be manufactured.

That is, the film having the substrate 8 and the atomic layer deposition film which is formed on the surface of the substrate 8 can be manufactured through: a first step where the substrate 8 is conveyed to the first zone 2 into which a first precursor 21 is introduced or to the second zone 3 into which a second precursor 31 is introduced; a second step where the substrate 8 is moved back and forth plural times between the first zone 2 and the second zone 3 while holding both edge portions of the substrate 8 in the width direction of the substrate 8 using the roller pairs 70 which constitute the conveyance roller part 7 and each of which is constituted of a pair of different rollers, that is, the guide roller 71 and the nip roller 72, and an atomic layer deposition film is formed on the surface of the substrate 8 by making a precursor adsorbed to the surface of the substrate 8; and a third step where the substrate 8 having a surface on which the atomic layer deposition film is formed is wound up.

The first step is a step where the substrate 8 having the surface on which an atomic layer deposition film is not formed is conveyed to the first zone 2 into which the first precursor 21 is introduced or to the second zone 3 into which the second precursor 31 is introduced. In this step, as in the case of the rolled film formation apparatus 1 shown in FIG. 1, the substrate 8 may be conveyed to the first zone 2 into which the first precursor 21 is introduced or to the second zone 3 into which the second precursor 31 is introduced through the third zone 4 into which the purge gas 41 is introduced. Usually, the substrate 8 having the surface on which an atomic layer deposition film is not formed is conveyed to the respective zones in order from the first zone 2 into which the first precursor 21 which is adsorbed to the substrate 8 and reacts with the second precursor 31 is introduced.

The second step is a step where an atomic layer deposition film is formed on the surface of the substrate 8 by moving the substrate 8 back and forth plural times between the first zone 2 and the second zone 3 while holding both edge portions of the substrate 8 in the width direction of the substrate 8 by the roller pairs 70. In this step, as in the case of the rolled film formation apparatus 1 shown in FIG. 1, it is preferable that the substrate 8 be moved back and forth through the third zone 4 into which the purge gas 41 is introduced for purging a surplus precursor.

EXAMPLES

Hereinafter, the present invention is explained in detail by reference to examples. However, the present invention is not limited to the matter described hereinafter.
Materials Used Materials used in the examples are described hereinafter.

In Example 1 and Comparative Example 1, a polyester film (thickness of 100 μm) is used as a substrate A, trimethylaluminum is used as a first precursor B (using a nitrogen gas as a carrier), ion water is used as a second precursor C (using a nitrogen gas as a carrier), and a nitrogen gas is used as an inert gas D in common.

In Example 1, a conveyance roller part X including guide rollers each having a surface on which grooves are formed as an uneven shape and nip rollers is used. On the other hand, in Comparative Example 1, a conveyance roller part Y including guide rollers each having a surface on which grooves are not formed as an uneven shape and nip rollers which are equal to the nip rollers which the conveyance roller part X includes is used.
Film Forming Method Performed Using Rolled Film Formation Apparatus 1

An atomic layer is deposited by repeating the atomic layer deposition cycle 100 times using the rolled film formation apparatus 1 which can repeat the atomic layer deposition cycle 100 times.

Firstly, the substrate A which is mounted on the unwinding roll 52 is conveyed to the third zone 4, and is conveyed to the first zone 2 through the conveyance roller part (X or Y) arranged in the third zone 4. The first precursor B is introduced into the first zone 2, and a discharge amount and a flow rate of a gas in the first zone 2 are adjusted by setting a pressure in the first zone 2 to 50 Pa. Then, during a time that the substrate A is moved to the inside of the first zone 2 through the conveyance roller part (X or Y), the first precursor B is adsorbed to both surfaces of the substrate A in saturation.

The substrate A having both surfaces into which the first precursor B is adsorbed in saturation is conveyed to the third zone 4 again. A purge gas D is introduced into the third zone 4 and a flow rate of a gas in the third zone 4 is adjusted by setting a pressure in the third zone 4 to approximately 50.5 Pa. Then, during a time that the substrate A is moved into the inside of the third zone 4, a surplus first precursor B is purged. After the surplus first precursor B is sufficiently purged, the substrate A is conveyed to the second zone 3.

The second precursor C is introduced into the second zone 3, and a discharge amount and a flow rate of a gas in the second zone 3 are adjusted by setting a pressure in the second zone 3 to 50 Pa. Then, during a time that the substrate A is moved into the inside of the second zone 3 through the conveyance roller part (X or Y), a first precursor B which is adsorbed to both surfaces of the substrate A in saturation reacts with the second precursor C so that one atomic layer is deposited to the substrate A.

A conveyance speed of the substrate A is determined based on a required purging time in the third zone 4. The film is formed while maintaining temperatures of all of the first zone 2, the second zone 3, and the third zone 4 at 90° C.
Result of Observation In both Example 1 and Comparative Example 1, a thickness of a formed aluminum oxide film is 10 nm.

The aluminum oxide film which is formed in Example 1 using guide rollers each having a surface on which a groove shape is formed as an uneven shape is observed using an electron microscope, and the degree of damage to the surface of the formed aluminum oxide film including edge portions of the aluminum oxide film is checked. As a result, there is no damage formed on the surface of the formed aluminum oxide film.

On the other hand, the aluminum oxide film which is formed in Comparative Example 1 using guide rollers each having a surface on which a groove shape is not formed as an uneven shape is observed by the same method as the aluminum oxide film formed in Example 1, and the degree of damage formed on the surface of the aluminum oxide film including edge portions of the aluminum oxide film is checked. As a result, there is no damage to the surface of the formed aluminum oxide film on a non-contact portion with the roller pairs which is a center portion in the width direction of the substrate. However, minute flaws are confirmed on the surface of the formed aluminum oxide film on contact portions with the roller pairs which are edge portions in the width direction of the substrate.

As has been described heretofore, it is understood that when the guide rollers each having a surface on which an uneven shape is formed are used, the deposition film formed on the surface of the substrate is not damaged also on the contact portions with the roller pairs.

It is also understood that also when the guide rollers each having a surface on which an uneven shape is not formed are not used, a deposition film formed on the surface of the substrate is not damaged on portions other than the contact portions with the roller pairs.

From these findings, it is understood that, by sandwiching both edge portions of the substrate using the guide rollers each having a surface on which an uneven shape is formed, a deposition film formed on the surface of the substrate is not damaged.

Further, it is estimated that a damage generated on a film formed on the surface of the substrate can be reduced not only when both edge portions of the substrate are sandwiched but also when only one edge portion of the substrate is sandwiched.

In regards to a gas barrier film for food packaging, it is desired to put on a market a transparent gas barrier film having an extremely high vapor transmissivity and a gas barrier property for the development of an organic EL display, an organic EL illumination and an organic solar cell which use a flexible substrate formed using an organic semiconductor.

A rolled film formation apparatus which forms a film by using an atomic layer deposition method has been studied. The atomic layer deposition method is a method which can form a thin film having the dense structure. From a viewpoint of superior advantages which the atomic layer deposition method possesses, the atomic layer deposition method is used in forming an insulation film in a DRAM or a TFT. In a deposition step of forming a thin film by an atomic layer deposition method, a batch processing is adopted. On the other hand, to enhance productivity, a device which can process a plurality of Si wafers at the same time has been developed. However, there is a limit to the enhancement of productivity. Further, such a batch processing device cannot continuously form a film on a substrate which can be wound. Devices described in patent literatures 1, 2 are proposed so as to overcome these drawbacks.

Patent literatures 1, 2 describe the techniques for continuously forming a thin film by an atomic layer deposition method. In the deposition of an atomic layer, the cycle of atomic layer deposition which is constituted of the following steps is repeated plural times: a step of making a first precursor adsorbed to a surface of the substrate; a step of purging a surplus first precursor, a step of making the first precursor and a second precursor react with each other by exposing the first precursor to the second precursor, and a step of purging a surplus second precursor. Due to such techniques, a thin film having a desired film thickness can be acquired. As the precursors, for example, materials described in non-patent literature 1 can be used.

In general, in one cycle of the atomic layer deposition, a layer having a thickness of 0.01 nm to 0.2 nm inclusive, and a thickness of approximately 0.1 nm in average is formed.

Although a desired film thickness of the thin film differs depending on a usage, it has been known in general that in case of aluminum oxide, the thin film is required to have a film thickness of 10 nm or more to acquire a film of high barrier property having vapor permeation of not more than $10^{-6}$ g/(m$^2$·day). Accordingly, to acquire an aluminum oxide layer having a film thickness of 10 nm, it is necessary to repeat the general atomic layer deposition cycle 100 times.

On the other hand, patent literature 3 describes a rolled atomic layer deposition device using a rotary drum. In this device, an atomic layer is deposited on a surface of a substrate during a time that the substrate is positioned above the rotary drum.

Patent literature 4 describes a rolled atomic layer deposition device using a spray manifold. In this device, an atomic layer is deposited on a surface of the substrate in a time that the substrate passes a position close to the spray manifold.

CITATION LIST

PTL 1: International Publication 07/112370
PTL 2: JP-T-2009-540122
PTL 3: JP-T-2007-522344
PTL 4: JP-T-2009-531548
NPL 1: M. Ritala, M. Leskela, in: H. S. Nalwa, Handbook of Thin Film Materials. Academic Press, San Diego, Calif., USA, Vol. 1, Chapter 2, P. 103-158

However, in the devices described in patent literatures 1, 2, to attain an atomic layer deposition film having a film thickness of 10 nm, the substrate has to pass through 100 sets of guide rollers. That is, the atomic layer deposition film is brought into contact with the guide rollers 100 times. A possibility that an atomic layer deposition film will be damaged or particles will be generated due to rubbing or slipping which occurs due to a contact between the atomic layer deposition film and the guide roller is not zero. Further, there is a possibility that performances of an atomic layer deposition film will be lowered due to damaging of an atomic layer or the adhesion of particles to the atomic layer deposition film.

The performance required for a conventional gas barrier film for food packaging is a vapor permeation rate of approximately $10^{-1}$ g/(m$^2$·day) and hence, small defects (rubbing flaws, pinholes, adhesion of particles or the like) do not matter. However, in using an atomic layer deposition film in an organic EL display or a polymer solar cell or in using an atomic layer deposition film in an organic semiconductor, a high performance, for example, a vapor permeation rate of not more than $10^{-6}$ g/(m$^2$·day) is requested. Accordingly, when a small defect is generated in the device, lowering of performance occurs which is not permissible. A transfer mechanism is described in paragraph 0007 of patent literature 1. However, the paragraph only states that it is desirable to use rollers, and it is also desirable to use guides which can support a substrate at least when the substrate is turned in the conveyance direction of the substrate. Further, paragraph 0030 of patent literature 1 also describes a conveyance mechanism. However, only the use of rollers is described as the conveyance mechanism.

On the other hand, patent literature 2 describes with respect to a conveying method that a contact between the roller 22 and the substrate 20 should be maintained at a minimum. This can be accomplished by placing the substrate 20 on a large diameter portion of the roller 22 having a spool shape (paragraph 0013). However, when a thickness of the substrate is small so that rigidity of the substrate is low, the substrate is brought into contact with not only the large diameter portion of the roller but also the whole portion of the roller having a spool shape. When an atomic layer deposition film is brought into contact with the guide roller, a defect such as a minute pinhole occurs in the atomic layer deposition film. Accordingly, the atomic layer deposition film cannot acquire desired performance. Particularly, when a substrate having low rigidity such as a thin plastic film substrate or a cloth is used, it is impossible to avoid a contact between a roller and a substrate.

Patent literature 2 describes, in addition to the above-mentioned description, that, alternatively a gripper which holds the substrate 20 as the substrate 20 is wound around each roller 22 may be provided at a peripheral portion of the roller 22 (paragraph 0013). However, patent literature 2 fails to disclose the details with respect to the gripper, a method of mounting the gripper on the periphery of the roller, and the conveyance mechanism.

Further, in the devices described in patent literatures 3 and 4, an atomic layer is not deposited on a surface of a substrate which is brought into contact with a rotary drum or a surface of a substrate not exposed to a spray manifold. Accordingly, neither patent literature 3 nor 4 suggests drawbacks caused by the use of the devices described in patent literatures 1, 2 such as damage to an atomic layer deposition film caused by a contact between a guide roller and a substrate in a processing step and lowering of a gas barrier performance brought about by such damage.

The present invention has been made to overcome the above-mentioned drawbacks, and it is an object of the present invention to provide a rolled film forming apparatus which can perform processing for continuously forming an atomic layer deposition film on a surface of a substrate which can be wound while preventing the occurrence of a damage to a substrate due to rubbing generated at the time of conveying the substrate and the adhesion of particles by slipping.

According to one aspect of the present invention, there is provided a rolled film formation apparatus which includes: a first vacuum chamber into which a first precursor is introduced; a second vacuum chamber into which a second precursor is introduced; a third vacuum chamber into which a purge gas used for purging the first precursor and the second precursor is introduced; and a conveyance roller part having a roller pair which conveys a rollable substrate to the first vacuum chamber, the second vacuum chamber and the third vacuum chamber, the roller pairs having a first roller and a second roller which sandwich the substrate in a thickness direction of the substrate, an uneven shape being formed on an outer peripheral surface of at least one of the first roller and the second roller, wherein an atomic layer deposition film is formed by depositing an atomic layer on a surface of the substrate by moving the substrate back and forth between the first vacuum chamber and the second vacuum chamber using the conveyance roller part.

According to the rolled film formation apparatus according to one aspect of the present invention, a contact portion between the roller and the substrate can be limited to both edges of the substrate only and hence, a region of the substrate damaged due to a contact with the roller or a region of the substrate where particles are adhered can be limited.

By sandwiching the substrate by one roller pair, the substrate can be surely sandwiched and can be conveyed in a stable manner.

Since an uneven shape is formed on the outer peripheral surface of the roller, a frictional force is generated with respect to the substrate and hence, slip prevention effect can be acquired. Accordingly, the substrate can be conveyed in a more stable manner.

By sandwiching both edges of the substrate, the substrate can be conveyed without slackening the substrate. Accordingly, the substrate can be sandwiched in a more stable manner. Due to these actions, rubbing or slipping generated due to a contact between the substrate and the roller can be reduced.

Further, in the rolled film formation apparatus according to one aspect of the present invention, it is preferable that the first roller be configured such that an axis of rotation of the first roller is rotatable about an axis orthogonal to the substrate.

In this case, the direction of the roller can be moved following the substrate and hence, the substrate can be conveyed in a state where a proper tension is applied to the substrate in the substrate width direction. As a result, slackening of the roller at the time of conveying the substrate can be prevented. Accordingly, the displacement between the substrate and the roller at the time of conveying the substrate can be reduced and hence, rubbing or slip which is generated by a contact between the substrate and the roller can be further reduced.

It is preferable that the rolled film formation apparatus according to one aspect of the present invention further includes a drive mechanism connected to the second roller.

In this case, a rotational speed of the roller can be controlled by the drive mechanism and hence, the substrate and the roller are brought into contact with each other in a stable manner whereby the substrate can be conveyed without causing any deformation of the substrate. Accordingly, the deformation of the substrate when the substrate is brought into contact with the conveyance roller part can be prevented.

According to the rolled film formation apparatus according to one aspect of the present invention, it is possible to provide the rolled film formation apparatus which can prevent a damage formed on the substrate due to rubbing generated by the conveyance of the substrate and the adhesion of particles due to slipping by sandwiching the substrate using the rollers in a stable manner.

DESCRIPTION OF REFERENCE NUMERALS

1: rolled film formation apparatus
2: first zone
3: second zone
4: third zone
5: unwinding chamber
6: winding chamber
7: conveyance roller part
8: substrate
9: guide rail
711: surface unevenness
X: opening portion width size
21: first precursor
22: first zone partition plate
31: second precursor
23: exhaust in first zone
32: second zone partition plate
33: exhaust in second zone
41: purge gas
51: unwinding chamber opening portion
52: unwinding roll
61: winding chamber opening portion
62: winding roll
70: roller pairs
71: guide roller
72: nip roller
A1: axis of rotation of guide roller 71
A2: axis of rotation of nip roller 72
A3: axis orthogonal to substrate 8

Obviously, numerous modifications and variations of the present invention are possible in light of the above teachings. It is therefore to be understood that within the scope of the appended claims, the invention may be practiced otherwise than as specifically described herein.

The invention claimed is:

1. A rolled film formation apparatus, comprising:
a first chamber in which a first precursor is applied to a substrate;
a second chamber in which a second precursor is applied to the substrate such that the first and second precursors react with each other and that an atomic layer is deposited on the substrate;
a third chamber in which a purge gas for purging the first or second precursor is applied to the substrate; and
a plurality of conveyance roller pairs positioned in the first chamber, the second chamber and the third chamber, and configured to convey the substrate,
wherein each of the conveyance roller pairs includes a first roller and a second roller configured to sandwich the substrate in a thickness direction of the substrate,
at least one of the first and second rollers has an outer peripheral surface having a surface unevenness, the surface unevenness is formed by a plurality of grooves formed on the outer peripheral surface of the second roller, the plurality of conveyance roller pairs is configured such that the substrate is moved back and forth among the first chamber, the second chamber and the third chamber, and that the atomic layer is deposited more than once on the substrate, and the grooves are formed in a direction parallel to an axis of rotation of the second roller.

2. The rolled film formation apparatus according to claim 1, wherein the first roller is configured such that an axis of rotation of the first roller is rotatable about an axis orthogonal to the substrate.

3. The rolled film formation apparatus according to claim 2, wherein the third chamber is positioned between the first chamber and the second chamber.

4. The rolled film formation apparatus according to claim 2, wherein each of the first chamber, the second chamber and the third chamber is provided in a plurality, and each of the third chambers is positioned between one of the first chambers and one of the second chambers.

5. The rolled film formation apparatus according to claim 2, wherein each of the first chamber, the second chamber and the third chamber is a vacuum chamber.

6. The rolled film formation apparatus according to claim 1, further comprising:

a drive mechanism connected to the second roller.

7. The rolled film formation apparatus according to claim 6, wherein the drive mechanism is a motor configured to control a rotation speed of the second roller.

8. The rolled film formation apparatus according to claim 1, wherein the first roller has a diameter smaller than a diameter of the second roller.

9. The rolled film formation apparatus according to claim 8, wherein the axis of rotation of the first roller is rotatable about the axis orthogonal to the substrate by 5 degrees or less.

10. The rolled film formation apparatus according to claim 8, wherein the axis of rotation of the first roller is rotatable about the axis orthogonal to the substrate by 0.5 degrees to 2 degrees.

11. The rolled film formation apparatus according to claim 1, wherein the third chamber is positioned between the first chamber and the second chamber.

12. The rolled film formation apparatus according to claim 11, wherein the first roller has a diameter smaller than a diameter of the second roller.

13. The rolled film formation apparatus according to claim 12, wherein the axis of rotation of the first roller is rotatable about the axis orthogonal to the substrate by 5 degrees or less.

14. The rolled film formation apparatus according to claim 12, wherein the axis of rotation of the first roller is rotatable about the axis orthogonal to the substrate by 0.5 degrees to 2 degrees.

15. The rolled film formation apparatus according to claim 14, further comprising:

a drive mechanism connected to the second roller.

16. The rolled film formation apparatus according to claim 15, wherein the drive mechanism is a motor configured to control a rotation speed of the second roller.

17. The rolled film formation apparatus according to claim 1, wherein each of the first chamber, the second chamber and the third chamber is provided in a plurality, and each of the third chambers is positioned between one of the first chambers and one of the second chambers.

18. The rolled film formation apparatus according to claim 1, wherein each of the first chamber, the second chamber and the third chamber is a vacuum chamber.

* * * * *